(12) United States Patent
Konishi et al.

(10) Patent No.: US 6,431,183 B1
(45) Date of Patent: Aug. 13, 2002

(54) METHOD FOR TREATING SEMICONDUCTOR SUBSTRATES

(75) Inventors: Toko Konishi; Cozy Ban; Yasuhiro Asaoka, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/059,385

(22) Filed: Apr. 14, 1998

(30) Foreign Application Priority Data

Oct. 9, 1997 (JP) ............................................. 9-277555

(51) Int. Cl.$^7$ ................................................ B08B 7/04
(52) U.S. Cl. ................... 134/1.3; 134/1; 134/2; 134/3; 134/26; 134/28; 134/102.1; 134/902
(58) Field of Search .................... 134/1, 1.3, 2, 3, 134/902, 100.1, 102.1, 26, 28, 29, 102.2

(56) References Cited

U.S. PATENT DOCUMENTS

| | | | |
|---|---|---|---|
| 5,364,510 A | * 11/1994 | Carpio | ............................. 134/2 |
| 5,415,191 A | * 5/1995 | Mashimo et al. | ......... 134/102.1 |
| 5,439,569 A | * 8/1995 | Carpio | .................. 422/68.1 X |
| 5,464,480 A | * 11/1995 | Matthews | .................. 134/1.3 |
| 5,560,857 A | * 10/1996 | Sakon et al. | ................. 510/175 |
| 5,567,244 A | 10/1996 | Lee et al. | |
| 5,634,980 A | 6/1997 | Tomita et al. | |
| 5,810,940 A | * 9/1998 | Fukazawa et al. | .............. 134/3 |

FOREIGN PATENT DOCUMENTS

| | | |
|---|---|---|
| JP | 60-239028 | 5/1984 |
| JP | 1-228590 | 3/1988 |
| JP | 4-114428 | 4/1994 |

OTHER PUBLICATIONS

Handbook of Semiconductor Wafer Cleaning Technology, NOyes Publications, pp. 51–52, 1993.*

* cited by examiner

*Primary Examiner*—Alexander Markoff
(74) *Attorney, Agent, or Firm*—McDermott, Will & Emery (57) ABSTRACT

A system for treatment of semiconductor substrates is comprised of an ozone generating means (11), an ejector (10) which dissolves ozone in a chemical solution or pure water to be used for treatment of semiconductor substrates, an ultraviolet light irradiating means (9) which irradiates the ozone-containing chemical solution or pure water with ultraviolet light, thereby controlling the concentration of ozone in the chemical solution or pure water, and a treating vessel (5) in which semiconductor substrates are treated with the chemical solution or pure water containing ozone in controlled concentrations. A system of wet-cleaning and etching of semiconductor substrates is provided having high yields without roughening the surface of the substrates.

12 Claims, 6 Drawing Sheets

(PRIOR ART)

METHOD FOR TREATING SEMICONDUCTOR SUBSTRATES

TECHNICAL FIELD

The present invention relates to a method and system for cleaning semiconductor substrates or treating semiconductor substrates ready for etching. More particularly, the present invention relates to a cleaning/etching method and a cleaning/etching apparatus for semiconductor substrates moving along the production line for cleaning or etching.

BACKGROUND ART

Production of semiconductors involves very important processes for wet-cleaning and etching semiconductor substrates or wafers. Higher density devices than before need further high-performance cleaning and etching. The wet-cleaning and etching processes in the production of semiconductors nowadays employ a variety of chemical solutions for specific individual objects. They include ammonia water, hydrochloric acid, hydrogen peroxide water, hydrofluoric acid, sulfuric acid, phosphoric acid, nitric acid, etc.

For example, removal of particles is usually accomplished by APM cleaning (with a mixed liquid of ammonia, hydrogen peroxide water, and water) and removal of metal is usually accomplished by SPM cleaning (with a mixed liquid of sulfuric acid and hydrogen peroxide water) or HPM cleaning (with a mixed liquid of hydrochloric acid, hydrogen peroxide water, and water).

Moreover, wet etching of silicon oxide film usually employs a mixed liquid of hydrofluoric acid and water or a mixed liquid of ammonium fluoride, hydrofluoric acid, and water (buffered hydrofluoric acid), and wet etching of silicon nitride film usually employs hot phosphoric acid. Thus, a variety of chemical solutions are indispensable for cleaning and wet etching.

Figure 9:
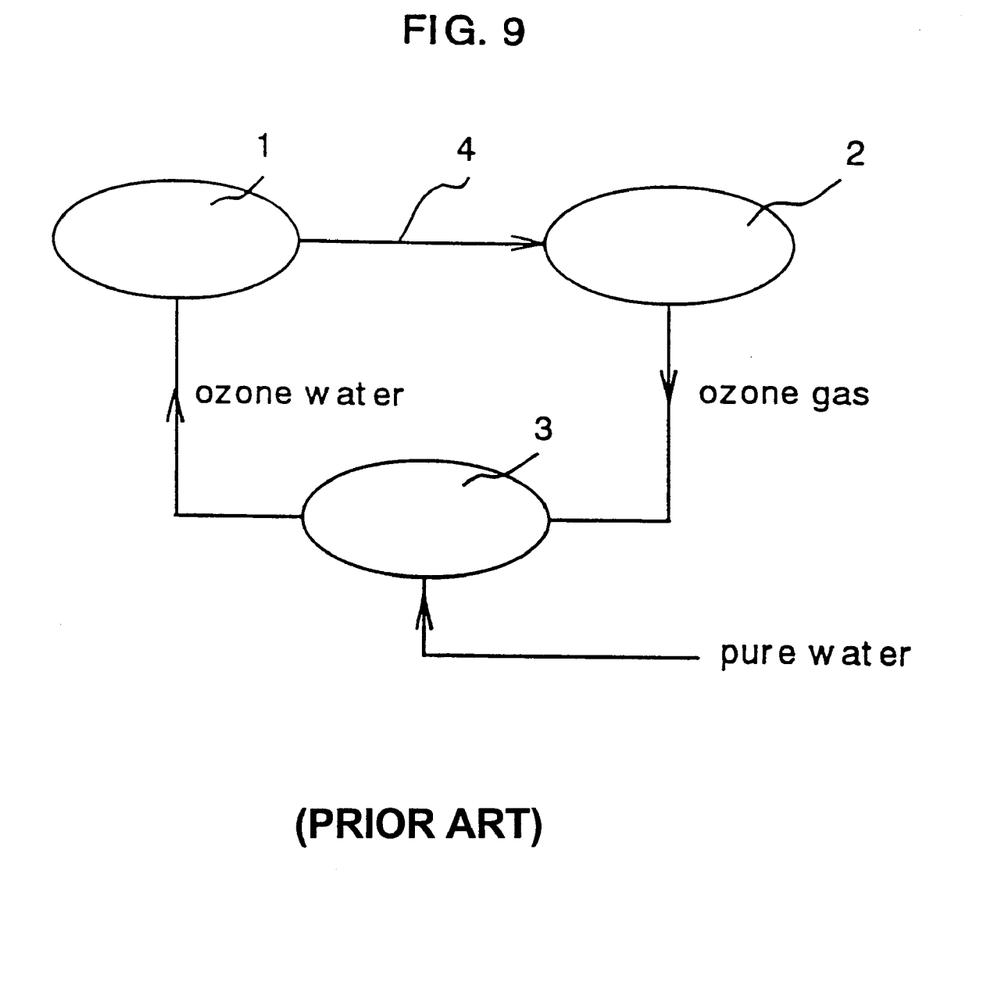
FIG. 9 shows a conventional cleaning system with ozone water for semiconductor substrates.

In the meantime, a recent development is cleaning with ozone water for removal of organic contaminants. A conventional cleaning system with ozone water is schematically shown in FIG. 9. A cleaning apparatus 1 permits the ozone concentration to be set as desired. The set value is sent to the ozone gas generating unit 2 through a signal circuit 4. An ozone gas generating unit 2 adjusts the discharge voltage according to the signals received, so that it generates as much ozone gas as necessary. The ozone gas is dissolved in pure water through membranes in the ozone dissolving unit 3. The resulting ozone water is supplied to the cleaning apparatus 1.

However, in the conventional cleaning system, setting the ozone concentration necessary for the cleaning apparatus 1 by adjusting the discharge voltage in the ozone gas generating unit 2 leads to the disadvantage that it takes time for the discharge voltage to become stable, it takes time for ozone gas of a prescribed amount to enter the ozone dissolving unit 3 (because of some distance between the ozone gas generating unit 2 and the ozone gas dissolving unit 3), and it takes time for ozone water of a desirable concentration to enter the cleaning apparatus 1.

Incidentally, the prior art technology of substrate treatment with an ozone-containing chemical solution or pure water is disclosed in Japanese Patent Laid-open No. Sho 60-239028 and U.S. Pat. No. 5,567,244. However, difficulties are presented in controlling the ozone concentration rapidly and freely.

DISCLOSURE OF THE INVENTION

It is an object of the present invention to provide a method and system of treating semiconductor substrates, said system and method being used in the wet cleaning and etching of semiconductor substrates so as to improve yields while preventing surface roughening. According to the present invention, the method and system for treatment employ ozone or ozone-containing active oxygen as the treating medium and are capable of freely controlling the concentration of ozone or ozone-containing active oxygen, thereby improving throughputs.

According to one aspect of the present invention, in a method of treating semiconductor substrates, ozone is generated and dissolved in a chemical solution or pure water for treatment of semiconductor substrates. The chemical solution or pure water in which the ozone has been dissolved is irradiated with ultraviolet light, and thereby the concentration of the ozone in the chemical solution or pure water is controlled. Then, semiconductor substrates are treated with the chemical solution or pure water containing the ozone in controlled concentrations.

According to another aspect of the present invention, in a method of treating semiconductor substrates, oxygen is generated and dissolved in a chemical solution or pure water for treatment of semiconductor substrates. The chemical solution or pure water in which the oxygen has been dissolved is irradiated with ultraviolet light, and thereby active oxygen is generated and the concentration thereof is controlled. Then, semiconductor substrates are treated with the chemical solution or pure water containing the active oxygen in controlled concentrations.

In the methods of treating semiconductor substrates, phosphoric acid is preferably employed as the chemical solution. Alternatively, hydrofluoric acid is preferably employed as the chemical solution.

In the methods of treating semiconductor substrates, the concentration of the hydrofluoric acid is preferably controlled to change during the treatment of the semiconductor substrates. Further, the concentration of the hydrofluoric acid and the concentration of the ozone are controlled preferably to change oppositely during treatment of the semiconductor substrates. Still further, the concentration of the hydrofluoric acid and the change of the concentration of the ozone are controlled preferably to change periodically oppositely during the treatment of the semiconductor substrates.

Other and further objects, features and advantages of the invention will appear more fully from the following description.

BEST MODE FOR CARRYING OUT THE INVENTION

Some embodiments of the present invention will be described below with reference to the accompanying drawings, in which like reference characters designate same or corresponding parts.

First Embodiment

Figure 1:
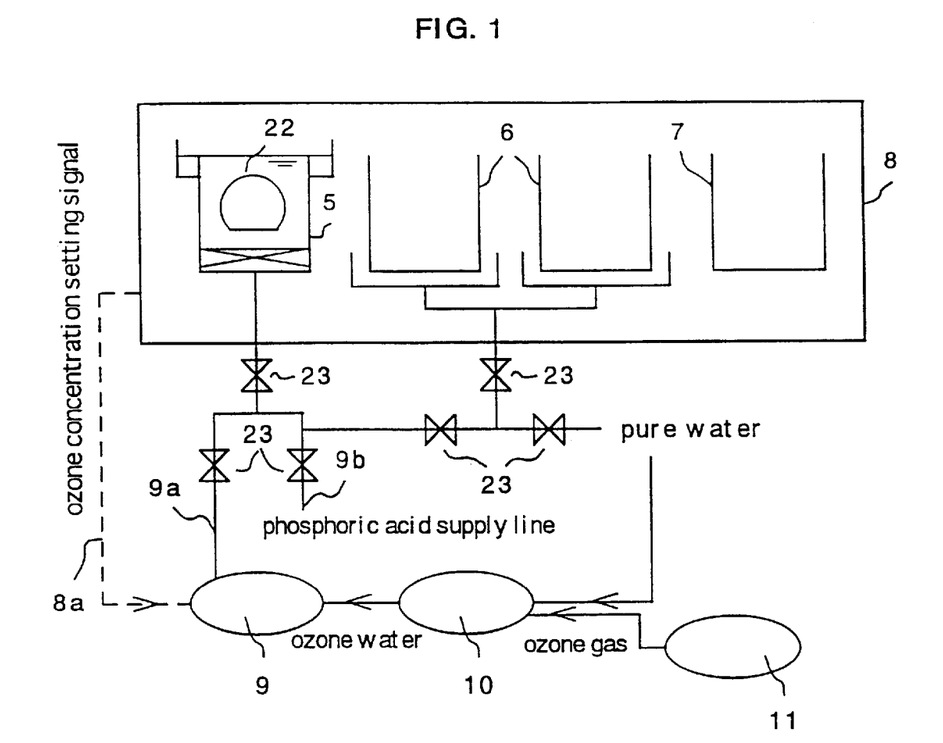
FIG. 1 shows a system of treating semiconductor substrates according to a first embodiment of the present invention.

According to a first embodiment of the present invention, a system of treating semiconductor substrates is constructed as shown in FIG. 1.

In FIG. 1, reference character 5 represents a vessel in which semiconductor substrates undergo cleaning or etching, 6 represents a vessel in which semiconductor substrates undergo water rinsing, 7 represents a vessel in which semiconductor substrates are dried, and 8 represents an apparatus for treating semiconductor substrates which is composed of the treating vessel 5, the water rinsing vessel 6, and the drying vessel 7.

In addition, 8a represents a passage for signals that establish the ozone concentration, 9 represents a means for irradiating ozone water with ultraviolet light (which serves also as a means for controlling the ozone concentration), 9a represents a pipe to supply ozone water, 9b represents a pipe to supply a chemical solution (such as phosphoric acid), 10 represents an ejector for dissolving ozone in pure water, 11 represents a means for generating ozone gas, 22 represents semiconductor substrates (such as silicon wafers) placed in the treating vessel 5, and 23 represents a valve to control the supply of pure water and phosphoric acid.

The above-mentioned system of treating semiconductor substrates works batchwise in the following manner. The treating vessel 5 is supplied with a mixture of hot phosphoric acid (as a chemical solution) through the pipe 9b and ozone-containing water through the pipe 9a. is Semiconductor substrates 22 are treated with the mixture in the treating vessel 5, rinsed with water in the water-rinsing vessel 6, and finally dried in the drying vessel 7.

In the substrate treating system, the ozone gas generating means 11 generates ozone gas, which enters the ejector 10 in which ozone is dissolved in pure water through a polyolefin membrane. The pure water is irradiated with ultraviolet light in the UV light irradiating means 9 so as to decompose ozone. Thus the ozone water of prescribed concentration is supplied to the treating vessel 5.

The ozone water supplied in combination with hot phosphoric acid offers the advantage of forming silicon oxide film on the surface of silicon substrate, thereby preventing the substrate surfaces from being exposed directly to hot phosphoric acid and hence preventing the surface of silicon substrates from becoming rough. This is what differentiates this embodiment from the conventional technology in which treatment of silicon substrates with hot phosphoric acid alone causes surface roughening.

The supply of ozone water is explained below. In the conventional technology shown in FIG. 9, the cleaning apparatus 1 is supplied with ozone water of desired concentration. Once the ozone concentration is established, signals are sent to the ozone gas generating means 2 in which the discharge voltage is controlled accordingly so that the amount of ozone to be generated is controlled.

By contrast, this embodiment differs from the conventional technology in that the signals to establish the desired ozone concentration are sent to the UV light generating means 9 through the signal passage 8a so that the ozone concentration is controlled by the dosage of UV light. In other words, a constant amount (maximum amount) of ozone gas is supplied from the ozone generating means 11 to the ejector 10 in which ozone is dissolved in pure water. The ozone-containing water is introduced into the UV light irradiating means 9 in which the ozone-containing water is irradiated with UV light to decompose ozone to such an extent that the desired ozone concentration is obtained. The water containing ozone in a desired concentration is supplied to the substrate treating apparatus 8. This arrangement obviates the necessity of controlling the generation of ozone gas by adjusting the discharge voltage. This in turn eliminates time required for the voltage to become stable and also permits an arbitrary distance between the ozone gas generating means 11 and the ejector 10.

As explained above, the first embodiment is exempt from roughening (and damaging) the surface of semiconductor substrates unlike the conventional technology which employs hot phosphoric acid alone for treatment. This leads to improved yields. In addition, it can control the ozone concentration in a short time by means of the dosage of UV light. This leads to improved throughputs.

Second Embodiment

Figure 2:
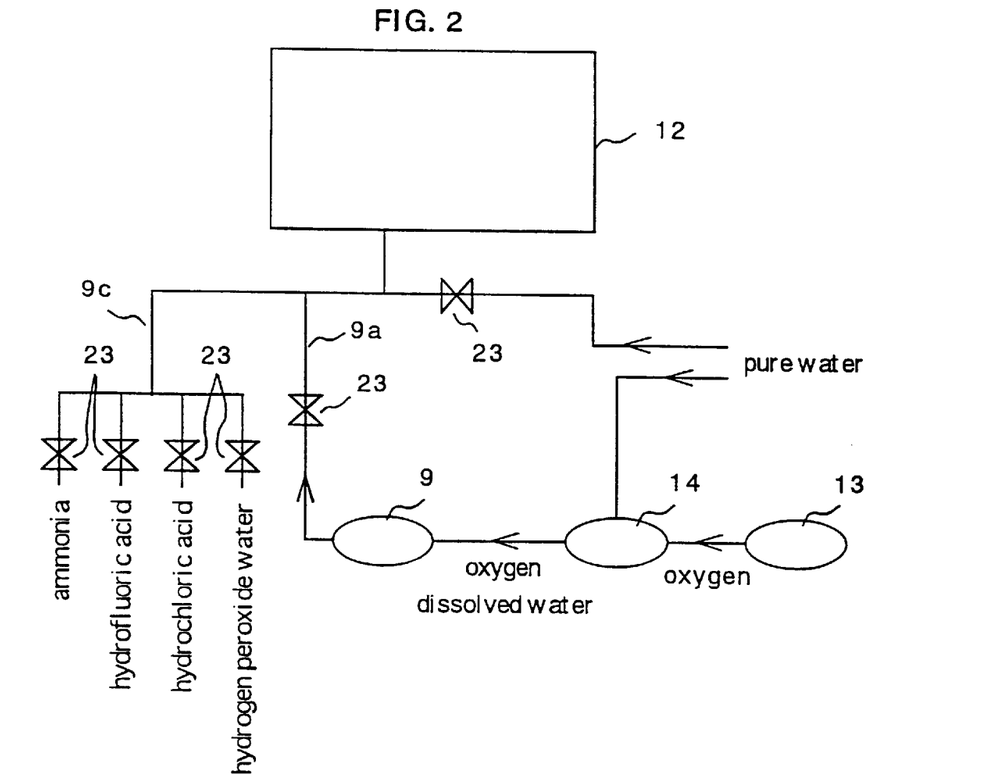
FIG. 2 shows a system of treating semiconductor substrates according to a second embodiment of the present invention.

According to a second embodiment of the present invention, the system of treating semiconductor substrates is constructed as shown in FIG. 2.

In FIG. 2, reference character 12 represents a treating vessel of a one-bath type in which semiconductor substrates are treated, 13 represents an oxygen gas generating means, 14 represents an ejector for dissolving oxygen gas in pure water, 9 represents a means for UV light irradiation (to control the concentration of ozone-containing active oxygen), 9a represents a pipe to supply water containing dissolved therein ozone-containing active oxygen, 9b represents a pipe to supply a chemical solution, and 23 represents a valve to control the supply of a chemical solution or pure water.

This substrate treating system is of a one-bath type for batchwise operation. It has the single treating vessel 12 in which substrates undergo cleaning with a chemical solution, etching (with ammonia, hydrofluoric acid, hydrochloric acid, and hydrogen peroxide water individually or in combination with one another), water rinsing, and drying.

Moreover, this substrate treating system works in the following manner. The oxygen generating means 13 generates oxygen, which enters the ejector 14. In the ejector 14, oxygen is dissolved in pure water. The oxygen-containing water is then introduced into the UV light irradiating means 9 in which active oxygen (such as ozone) is generated by irradiation with UV light. The active oxygen is introduced into pure water or a chemical solution being supplied to the treating vessel 1.

In general, the substrate treating (cleaning) apparatus of the usual one-bath type takes a longer time to carry out cleaning and etching than that of multi-vessel type because the chemical solution in the bath has to be replaced with pure water by overflowing. Moreover, it has another disadvantage of requiring warm pure water to be supplied to the bath to replace the chemical solution with warm pure water by overflowing when it is necessary to increase the treating temperature. As a result, the surface of silicon substrates is exposed to warm water for a long period of time until replacement is completed. The consequence is a roughened surface. In the case of apparatus of a one-bath type, the surface of substrates is exposed to the chemical solution for a longer period of time than in the case of apparatus of a multi-bath type because replacement of the chemical solution with pure water takes time. This results in substrates with a rough surface.

By contrast, this substrate treating system works in such a manner that the oxygen generating means 13 generates oxygen, which enters the ejector 14 in which oxygen is dissolved in pure water, and the oxygen-containing pure water is introduced into the UV light irradiating means 9 in which ozone-containing active oxygen is generated by irradiation with UV light. The active oxygen-containing pure water is supplied to the treating vessel 12. As a result, the active oxygen forms a silicon oxide film on the surface of silicon substrates, thereby preventing the substrate surface from being exposed directly to warm water or chemical solution. This in turn prevents the substrate surface from becoming rough.

In this embodiment, the concentration of active oxygen (such as ozone) is controlled by the dosage of UV light in the UV light irradiating means 9. This offers the advantage of achieving the desired concentration in a short time and hence improving throughputs.

As explained above, even though the second embodiment employs a treating apparatus of a one-bath type, it is exempt from the surface roughening of semiconductor substrates due to prolonged exposure to warm water or chemical solution.

Third Embodiment

Figure 3:
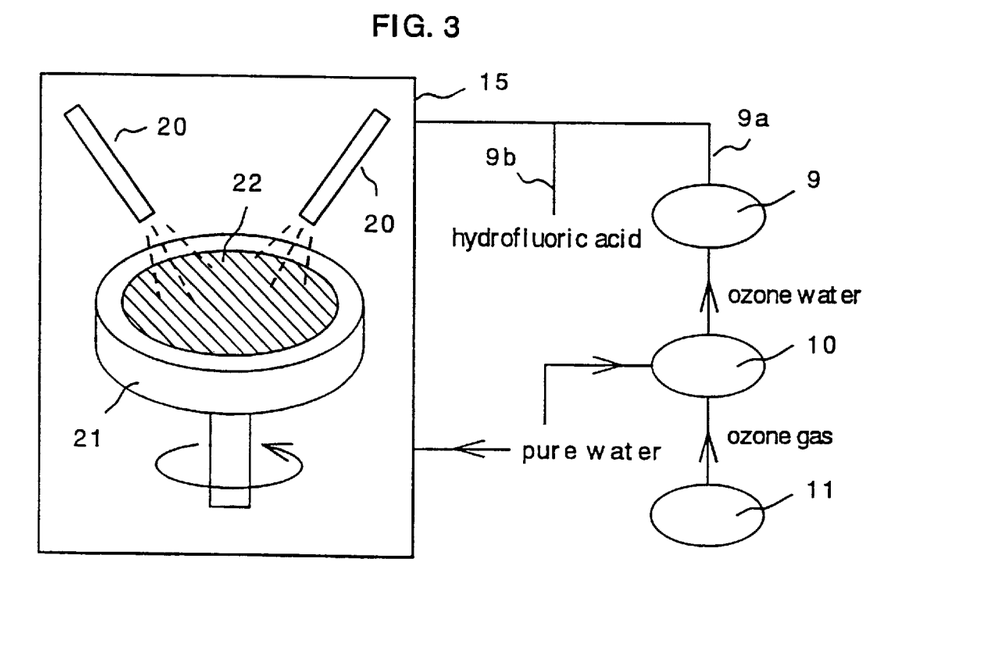
FIG. 3 shows a system of treating semiconductor substrates according to a third embodiment of the present invention.

According to a third embodiment of the present invention, the system of treating semiconductor substrates is constructed as shown in FIG. 3.

In FIG. 3, reference character 15 represents a spin type treating apparatus for treating (or cleaning) a single semiconductor substrate at a time, 20 represents an injection pipe through which a chemical solution or pure water is injected, 21 represents a stage on which a semiconductor substrate 22 is held, 9 represents a means for irradiating ultraviolet light (or a means for controlling the ozone concentration), 10 represents an ejector for ozone dissolution, and 11 represents an ozone generating means. The last three means are identical with those shown in FIG. 1.

This embodiment employs the substrate treating apparatus 15 of spin type which performs cleaning and etching silicon substrates one by one with hydrofluoric acid and ozone water.

This substrate treating apparatus 15 functions in such a manner that the stage 21 turns the semiconductor substrate 22 placed thereon and the turning substrate is sprayed with a cleaning chemical solution or pure water injected from the injection pipe 20.

This substrate treating system has the ozone generating means 11. The ozone gas enters the ejector 10 so that it is dissolved in pure water. The resulting ozone water is supplied to the treating apparatus 15. Hydrofluoric acid is also supplied to the treating apparatus 15 through the line 9b. If necessary, the ozone water is mixed with the hydrofluoric acid. Incidentally, the Ozone water is irradiated with ultraviolet light in the UV light irradiating means 9 (which is installed past the ejector 10) so that dissolved ozone is decomposed and the ozone concentration is adjusted as desired.

The substrate treating system in this embodiment functions as follows to treat or clean substrates.

Figure 4:
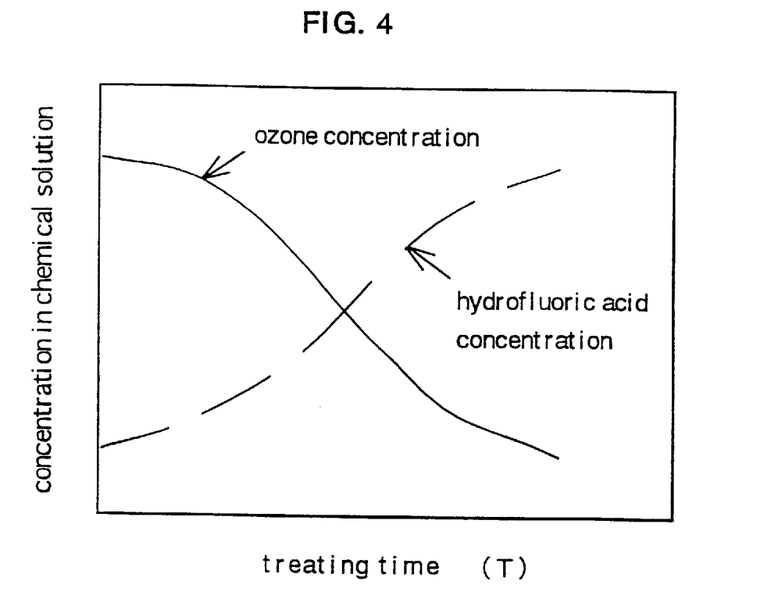
FIG. 4 shows a change of concentrations of hydrofluoric acid and ozone water in a system of treating semiconductor substrates according to a third embodiment of the present invention.

During treatment in this substrate treating system, the concentrations of hydrofluoric acid and ozone water are changed with the lapse of time as shown in FIG. 4. Unlike the prior art technology, this substrate treating system permits the ozone concentration to be controlled freely owing to the UV light irradiating means 9 which decomposes dissolved ozone.

During cleaning, ozone water is gradually decreased in concentration and hydrofluoric acid is gradually increased in concentration as shown in FIG. 4. The initially supplied ozone water in high concentration removes organic matter and forms silicon oxide film. On the other hand, the hydrofluoric acid which is increasing in concentration removes the silicon oxide film. In this way it is possible to remove both organic and inorganic contaminants in a single cleaning step. In addition, ozone changes the surface potential of the substrate, thereby keeping away metal contaminants (such as copper)

As explained above, the third embodiment permits the removal of both organic and inorganic contaminants in a single cleaning step and also keeps away metal contaminants after cleaning with hydrofluoric acid owing to ozone added to pure water, unlike the prior art technology. Therefore, it is capable of high-performance cleaning in a short time and results in improved throughputs and yields.

Fourth Embodiment

Figure 5:
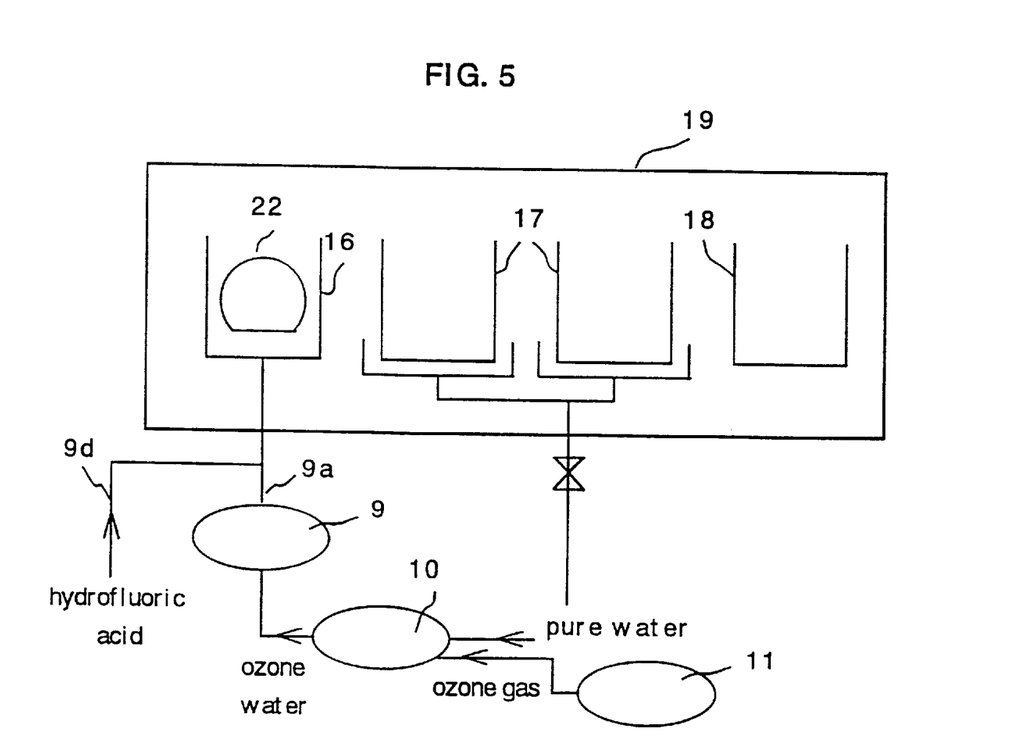
FIG. 5 shows a system of treating semiconductor substrates according to a fourth embodiment of the present invention.

According to a fourth embodiment of the present invention, the system of treating semiconductor substrates is constructed as shown in FIG. 5.

In FIG. 5, reference character 16 represents a treating vessel in which silicon semiconductor substrates undergo treatment with hydrofluoric acid, 17 represents a rinsing vessel in which semiconductor substrates are rinsed with water, 18 represents a drying vessel in which semiconductor substrates are dried, and 19 represents a treating apparatus for treating (or cleaning) semiconductor substrates which is comprised of the treating vessel 16, the water washing vessel 17, and the drying vessel 18. In addition, 9 represents a means for irradiating ultraviolet light (or a means for controlling ozone concentrations), 9a represents a pipe line to supply ozone water, 9b represents a pipe line to supply a chemical solution such as hydrofluoric acid, 10 represents an ejector for dissolving ozone, and 11 represents a means for generating ozone. They are identical with those shown in FIG. 3.

This substrate treating system is of a dip type for batchwise operation. In its operation, semiconductor substrates 22 in the treating vessel 16 are treated with a mixture of a hydrofluoric acid supplied through the pipe line 9b and ozone water supplied through the pipe line 9a. Subsequently, they are rinsed with water in the water rinsing vessel 17 and dried in the drying vessel 18.

In the substrate treating system, the ozone generating means 11 generates ozone gas, which enters the ejector 10 for dissolution in pure water, and the resulting ozone water is supplied to the treating vessel 16 (for treatment with hydrofluoric acid). The substrate treating system also has the UV light irradiating means 9 between the ejector 10 and the treating vessel 16, which controls the ozone concentration.

The substrate treating system in this embodiment functions as follows to treat or clean substrates.

Figure 6:
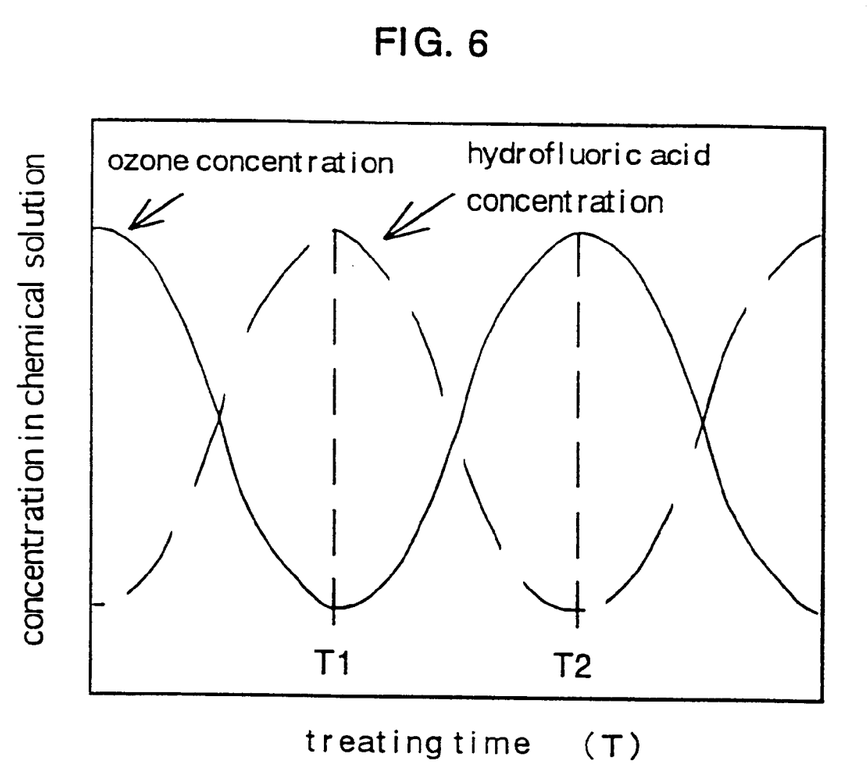
FIG. 6 shows a change of concentrations of hydrofluoric acid and ozone water in a system of treating semiconductor substrates according to a fourth embodiment of the present invention

During treatment in this substrate treating system, the concentrations of hydrofluoric acid and ozone water are changed with the lapse of time as shown in FIG. 6. This substrate treating system permits the ozone concentration to be controlled freely owing to UV light irradiation in the ozone generating means 11.

As shown in FIG. 6, the concentration of hydrofluoric acid and the concentration of ozone periodically change in such a way that the former increases as the latter decreases, and vice versa. Controlling concentrations in this manner changes the substrate surface in a wide range from a complete hydrophobic state to a complete hydrophilic state. For example, the substrate withdrawn from the chemical solution at time T1 has a completely hydrophobic surface, whereas the substrate withdrawn from the chemical solution at time T2 has a hydrophilic surface attributable to silicon oxide film formed by ozone.

As explained above, the fourth embodiment permits the surface state of substrates to be controlled after cleaning. This permits the process to be applied in a wide range. In addition, surface oxidation with ozone water and oxide film etching with hydrofluoric acid which are carried out alternately give rise to substrates with a clean surface free from contaminants and damages.

Fifth Embodiment

Figure 7:
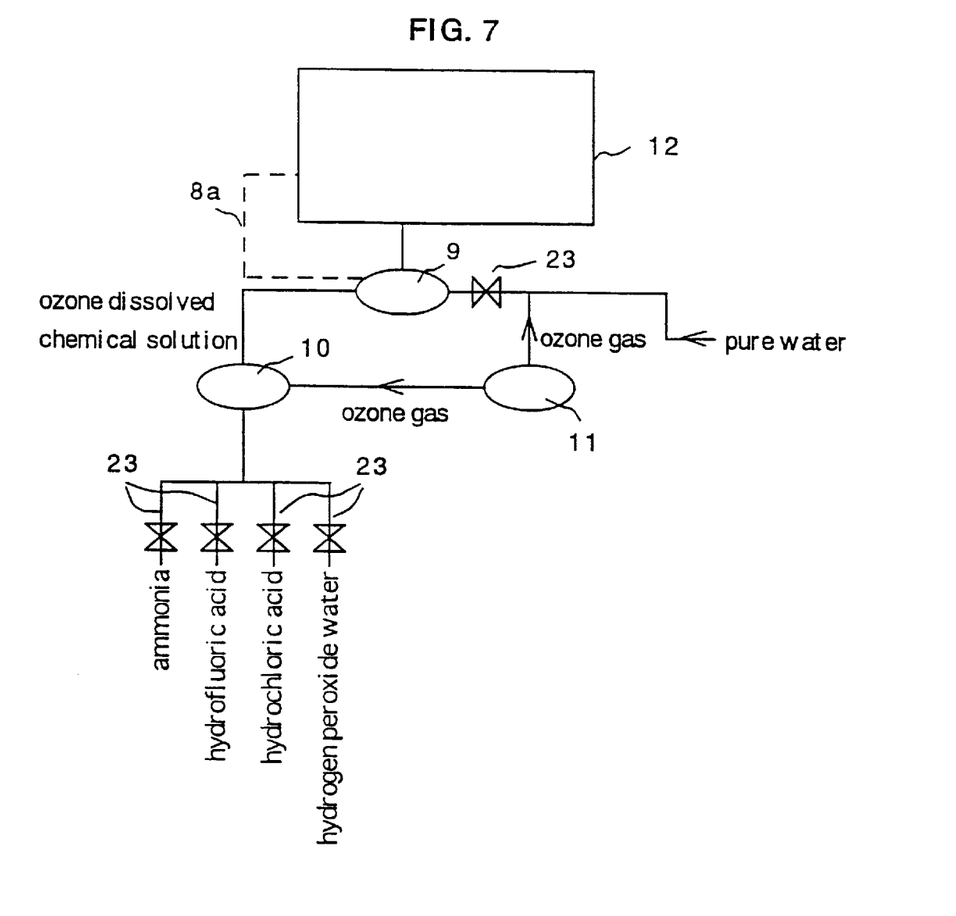
FIG. 7 shows a system of treating semiconductor substrates according to a fifth embodiment of the present invention.

According to a fifth embodiment of the present invention, the system of treating semiconductor substrates is constructed as shown in FIG. 7.

In FIG. 7, reference character 9 represents a means for irradiating ultraviolet light (or a means for controlling the ozone concentration), 10 represents an ejector for dissolution of ozone, and 11 represents a means for generating ozone gas. These means are identical with those shown in FIG. 1. In addition, 12 represents an apparatus of a one-bath type for treating (or cleaning) semiconductor substrates, which is identical with that shown in FIG. 2.

This substrate treating system is of a one-bath type like that shown in FIG. 2. In other words, the treating vessel 12 is designed for all of cleaning with a chemical solution, etching, water rinsing, and drying. The chemical solution for etching is ammonia water, hydrofluoric acid, hydrochloric acid, or hydrogen peroxide, or a mixture thereof. It is supplied under control by the valve 23. If necessary, it is mixed with pure water.

Further, this substrate treating system works in the following manner. The ozone generating means 11 generates ozone, which enters the ejector 10 installed in the pipe line to supply the chemical solution. In the ejector 10, ozone is dissolved in the chemical solution. The ozone-containing chemical solution is then introduced into the UV light irradiating means 9 in which ozone is decomposed by irradiation with UV light. Thus the cleaning apparatus is supplied with the chemical solution containing ozone in prescribed concentrations.

In an alternative mode of operation, the cleaning apparatus is supplied with pure water containing ozone in prescribed concentrations. This is achieved by installing another ejector (not shown) in the line to supply pure water so that ozone is dissolved in pure water and by irradiating the ozone-containing pure water in the UV light irradiating means 9, thereby decomposing ozone.

Figure 8:
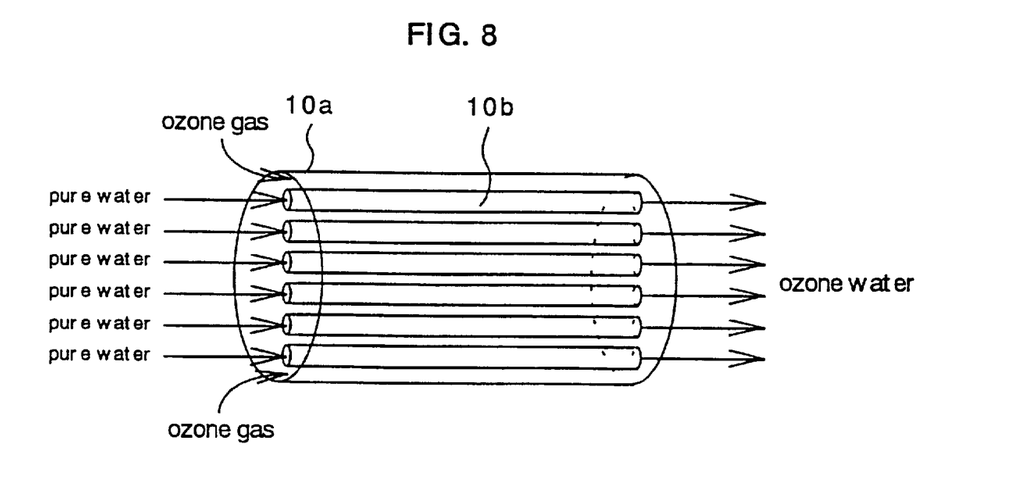
FIG. 8 shows an ejector used in the first to fifth embodiments of the present invention.

FIG. 8 shows the ejector 10 used in the first to fifth embodiments of the present invention.

The ejector 10 is made up of an outer pipe 10a and a plurality of inner pipes 10b of smaller diameter enclosed therein. The outer pipe 10a permits ozone (or oxygen) to pass through, and the inner pipes permit pure water or a chemical solution to pass through. The inner pipes 10b are made of polyolefin membrane, so that ozone gas (or oxygen) permeates through it to dissolve in pure water or a chemical solution.

The UV light irradiating means 9 used in the first to fifth embodiments of the present invention may be the same as or similar to that disclosed in Japanese Patent Laid-open No. Hei 1-228590, except that it has an additional means to control the amount of UV light generated or irradiated.

The ozone-containing chemical solution or the ozone-containing pure water is supplied in the following manner.

In the fifth embodiment, the substrate treating (or cleaning) apparatus 12 sends a signal for a desired ozone concentration to the UV light irradiating means 9 (or the ozone concentration controlling means) through the signal passage 8a. The dosage of UV light is controlled accordingly so that the ozone concentration is controlled as desired. In other words, the ozone gas generating means 11 generates a constant (or maximum) amount of ozone gas at all times. The ozone gas enters the ejector 10, in which it dissolves in the chemical solution. The ozone-containing chemical solution enters the UV light irradiating means 9, in which it is irradiated with UV light so that ozone is decomposed to such an extent that the ozone concentration is reduced to the desired level. The chemical solution containing as much ozone as necessary is supplied to the substrate treating apparatus 12. This system obviates the necessity of controlling the discharge voltage to control the generation of ozone gas. This in turn eliminates time required for the voltage to become stable and also permits an arbitrary distance between the ozone gas generating means and the ejector.

In general, the substrate treating (cleaning) apparatus of the usual one-bath type takes a longer time to carry out cleaning and etching than that of multi-vessel type because the chemical solution in the bath has to be replaced with pure water by overflowing. Moreover, it has another disadvantage of requiring warm pure water to be supplied to the bath to replace the chemical solution with warm pure water by overflowing when it is necessary to increase the treating temperature. As a result, the surface of silicon substrates is exposed to warm water for a long period of time until replacement is completed. The consequence is a roughened surface. In the case of the apparatus of one-bath type, the surface of substrates is exposed to the chemical solution for a longer period of time than in the case of the apparatus of a multi-bath type because replacement of the chemical solution with pure water takes time. This results in substrates with a rough surface.

By contrast, this substrate treating system works in such a manner that the ozone generating means 11 generates ozone, which enters the ejector 10 in which ozone is dissolved directly in pure water or chemical solution for treatment, and the ozone-containing pure water or chemical solution is introduced into the UV light irradiating means 9 in which the concentration of dissolved ozone is adjusted by irradiation with UV light. The ozone-containing pure water or chemical solution is supplied to the treating vessel 12. As a result, the ozone forms a silicon oxide film on the surface of silicon substrates, thereby preventing the substrate surface from becoming rough.

In addition, controlling the ozone concentration by the dosage of UV light irradiation takes only a short time. This leads to improved throughputs.

As explained above, the fifth embodiment performs treatment or cleaning without causing the surface roughening of substrates even when substrates are exposed to the chemical solution or warm water for a long period of time in the cleaning apparatus of the one-bath type. Therefore, it contributes to improved yields.

The effects and advantages of the present invention may be summarized as follows.

As mentioned in detail above, the present invention provides a system or method of treating semiconductor substrates which employs a chemical solution or pure water containing ozone in prescribed concentrations for treatment or cleaning of semiconductor substrates. During operation, ozone is dissolved in a chemical solution or pure water and the ozone-containing chemical solution or pure water is irradiated with ultraviolet light so that the concentration of ozone in the chemical solution or pure water is controlled as desired. Treatment or cleaning of silicon semiconductor substrates with the chemical solution or pure water containing ozone in controlled concentrations offers the advantage of preventing the substrate surface from becoming rough due to exposure to the chemical solution or warm water.

In another aspect of the present invention, the system or method of treating semiconductor substrates employs a chemical solution or pure water containing active oxygen in controlled concentrations which is produced by dissolving oxygen in a chemical solution or pure water and irradiating the oxygen-containing chemical solution or pure water with ultraviolet light. This active oxygen prevents the substrate surface from becoming rough due to exposure to the chemical solution or warm water.

In another aspect of the present invention, the system or method of treating semiconductor substrates employs a means for controlling the concentration of active oxygen or ozone in the chemical solution or pure water by irradiation with ultraviolet light. Therefore, it permits the rapid and free control of the concentration of ozone or active oxygen. This leads to improved throughputs.

In another aspect of the present invention, the system or method of treating semiconductor substrates offers the advantage of preventing the substrate surface from being roughened or damaged by treatment with phosphoric acid, particularly hot acid.

In another aspect of the present invention, the system or method of treating semiconductor substrates employs hydrofluoric acid as the chemical solution and controls its concentration in relation to the ozone concentration. This makes it possible to remove both organic and inorganic contaminants in a single cleaning step.

In another aspect of the present invention, the system or method of treating semiconductor substrates employs ozone or active oxygen and hydrofluoric acid while periodically controlling their concentrations in such a manner that the concentration of the former increases as the concentration of the latter decreases, and vice versa. Therefore, it removes damage from the substrate surface and freely controls the surface state of the substrate after cleaning.

Obviously many modifications and variations of the present invention are possible in the light of the above teachings. It is therefore to be understood that within the scope of the appended claims the invention may by practiced otherwise than as specifically described.

What is claimed is:

1. A method of treating semiconductor substrates which comprises the steps of:

generating ozone;

dissolving said ozone in water for treatment of semiconductor substrates;

dosing with ultraviolet light said water in which said ozone has been dissolved, said dosing step adjusting the concentration of ozone dissolved in said water by reducing the concentration; and treating semiconductor substrates with said water containing said ozone in said adjusted concentration or a chemical solution comprising said water containing said ozone in said adjusted concentration, wherein said water containing said ozone in said adjusted concentration or said chemical solution comprising said water containing said ozone in said adjusted concentration is prepared before treating said semiconductor substrates therewith, and wherein said dosing step adjusting the concentration of ozone dissolved in said water by changing the concentration periodically when the concentration of ozone dissolved in said water changes in the opposite direction of the concentration of said chemical solution.

2. The method of treating semiconductor substrates as defined in claim 1, in which said chemical solution further comprises phosphoric acid.

3. The method of treating semiconductor substrates as defined in claim 1, in which said chemical solution further comprises hydrofluoric acid.

4. The method of treating semiconductor substrates as defined in claim 3, in which the concentration of said hydrofluoric acid is controlled to change during the treatment of said semiconductor substrates.

5. The method of treating semiconductor substrates as defined in claim 4, in which the concentration of said hydrofluoric acid and the concentration of said ozone are controlled to change oppositely during the treatment of said semiconductor substrates.

6. The method of treating semiconductor substrates as defined in claim 5, in which the concentration of said hydrofluoric acid and the change of the concentration of said ozone are controlled to change periodically oppositely during the treatment of said semiconductor substrates.

7. A method of treating semiconductor substrates which comprises the steps of:

generating oxygen at a first location;

at a second location different from the first location, dissolving said oxygen in water for treatment of semiconductor substrates;

dosing with ultraviolet light said water in which said oxygen has been dissolved, said dosing step including generating active oxygen and adjusting the concentration thereof by reducing the concentration; and treating semiconductor substrates with said water containing said active oxygen in said adjusted concentration or a chemical solution comprising said water containing said active oxygen in said adjusted concentration, wherein said water containing said active oxygen in said adjusted concentration or said chemical solution comprising said water containing said active oxygen in said adjusted concentration is prepared before treating said semiconductor substrates therewith.

8. The method of treating semiconductor substrates as defined in claim 7, in which said chemical solution further comprises phosphoric acid.

9. The method of treating semiconductor substrates as defined in claim 7, in which said chemical solution further comprises hydrofluoric acid.

10. The method of treating semiconductor substrates as defined in claim 9, in which the concentration of said hydrofluoric acid is controlled to change.

11. The method of treating semiconductor substrates as defined in claim 10, in which the concentration of said hydrofluoric acid and the concentration of said active oxygen are controlled to change oppositely during the treatment of said semiconductor substrates.

12. The method of treating semiconductor substrates as defined in claim 11, in which the concentration of said hydrofluoric acid and the change of the concentration of said active oxygen are controlled to change periodically oppositely during the treatment of said semiconductor substrates.

* * * * *